United States Patent
Yao

(10) Patent No.: US 10,002,979 B1
(45) Date of Patent: Jun. 19, 2018

(54) UNIPOLAR DOPING IN PHOTODIODE AND PHOTOTRANSISTOR

(71) Applicant: WAVEFRONT HOLDINGS, LLC, Basking Ridge, NJ (US)

(72) Inventor: Jie Yao, Plainsboro, NJ (US)

(73) Assignee: WAVEFRONT HOLDINGS, LLC, Basking Ridge, NJ (US)

( * ) Notice: Subject to any disclaimer, the term of this patent is extended or adjusted under 35 U.S.C. 154(b) by 0 days. days.

(21) Appl. No.: 15/608,685

(22) Filed: May 30, 2017

(51) Int. Cl.
| | |
|---|---|
| *H01L 27/146* | (2006.01) |
| *H01L 31/0352* | (2006.01) |
| *H01L 31/105* | (2006.01) |
| *H01L 31/107* | (2006.01) |
| *H01L 31/11* | (2006.01) |
| *H01L 31/0304* | (2006.01) |
| *H01L 31/18* | (2006.01) |
| *H01L 27/144* | (2006.01) |

(52) U.S. Cl.
CPC .... *H01L 31/03529* (2013.01); *H01L 27/1446* (2013.01); *H01L 27/14649* (2013.01); *H01L 27/14681* (2013.01); *H01L 31/03042* (2013.01); *H01L 31/03046* (2013.01); *H01L 31/105* (2013.01); *H01L 31/1075* (2013.01); *H01L 31/1105* (2013.01); *H01L 31/1844* (2013.01)

(58) Field of Classification Search
CPC ......... H01L 31/03529; H01L 27/14681; H01L 27/14649; H01L 27/1446; H01L 31/1844; H01L 31/03046; H01L 31/1105; H01L 31/1075; H01L 31/105; H01L 31/03042
See application file for complete search history.

(56) References Cited

U.S. PATENT DOCUMENTS

| | | | |
|---|---|---|---|
| 7,202,102 B2 * | 4/2007 | Yao | .................... H01L 31/03046 |
| | | | 257/E21.125 |
| 2010/0237455 A1 | 9/2010 | Lee | |
| 2011/0291158 A1 * | 12/2011 | Ogura | ................... H01L 31/1105 |
| | | | 257/187 |

OTHER PUBLICATIONS

S.M. Sze et al., "Chapter 13: Photodetectors and Solar Cells", Physics of Semiconductor Devices, 3rd Edition, 2007, pp. 663-742.

* cited by examiner

*Primary Examiner* — David Vu
(74) *Attorney, Agent, or Firm* — Pillsbury Winthrop Shaw Pittman, LLP

(57) ABSTRACT

Disclosed are a semiconductor photodiode (PD) or phototransistor (PT) photo detector with a unipolarly doped edge region containing a portion of the photon absorption layer and occupying over 99% of the photo detector area as projected on a plane parallel to the semiconductor substrate. Embodiments also relate to methods of making the photo detector.

20 Claims, 8 Drawing Sheets

Figure 1 Si photodiode cross section

*prior art*

UNIPOLAR DOPING IN PHOTODIODE AND PHOTOTRANSISTOR

This invention was made with Government support under SBIR contracts M67854-14-C-6530 and HQ0147-15-C-7245 awarded by the U.S. Department of Defense. The Government has certain rights in the invention.

BACKGROUND

1. Field of the Embodiments

The embodiments relate to semiconductor photodiodes (PD) and phototransistors (PT) with a unipolarly doped edge region containing a portion of the photon absorption layer and occupying over 99% of the photo detector area as projected on a plane parallel to the semiconductor substrate. Embodiments also relate to methods of making the photo detector.

2. Background Discussion

Similar to a photodiode, a phototransistor generates an output current dependent on the flux of incident light on the phototransistor. Photons absorbed in a phototransistor generate electron-hole pairs collected by p-n junctions. Minority carriers collected by the p-n junctions operate as a base current. The base current is amplified based on a bipolar transistor gain, thereby generating a collector current. The very small number of photo generated carriers, depending on the location of origin, can either flow to the emitter and reduce the emitter current or flow to the collector to enhance the collector current. An emitter current or the collector current is generally used as an output current. Conventional phototransistors and their use in sensors are disclosed in, for example, U.S. Patent Application Publication No. 2010/0237455; and S. M. Sze and Kwok K. Ng, "Physics of Semiconductor Devices", 3rd edition, Wiley Interscience, John Wiley & Sons, Inc., 2007, ISBN-13: 978-0-471-14323-9, ISBN-10: 0-471-14323-5. Chapter 13 "Photodetectors and Solar Cells", Section 13.5 "Phototransistors", pp. 694-697, the disclosures of which are incorporated by reference herein in their entirety.

SUMMARY

Aspects of the present disclosure relate to unipolar doping of photodiode (PD) & phototransistor (PT) photo detectors. Some aspects of the present disclosure relate to a semiconductor photodiode (PD) or phototransistor (PT) photo detector with a unipolarly doped edge region containing a portion of the photon absorption layer and occupying over 99% of the photo detector area as projected on a plane parallel to the semiconductor substrate.

Some aspects of the present disclosure relate to an uppermost unipolarly doped and not completely depleted semiconductor common layer comprising the same doping polarity throughout the layer. A photon absorption layer may be positioned at least partially within and/or above the common layer, and comprise at least a doped photon absorption region. A unipolarly doped edge region may be positioned at least partially within and/or above the common layer, wherein the edge region includes at least a portion of the photon absorption layer, may be geometrically connected to the common layer, and comprise a same doping polarity as the common layer. A bipolarly doped center region may be positioned at least partially within and/or above the common layer, the center region comprising at least one segment of a doping polarity opposite to the doping polarity of the common layer, and comprising at least one p-n or p-i-n junction. The unipolarly doped edge region and the bipolarly doped center region may be in direct physical contact with each other. The area of the unipolarly doped edge region may be at least 100 times greater than the area of the bipolarly doped center region as projected on a plane parallel to the common layer. A dielectric and an electrical contact may physically and directly contact the semiconductor top surface. The photon absorption layer may be positioned completely within and/or above the common layer, the unipolarly doped edge region may be positioned completely within and/or above the common layer, and the bipolarly doped center region may be positioned completely within and/or above the common layer. The unipolarly doped edge region may extend from the common layer to a planar semiconductor top surface, and the bipolarly doped center region may extend from the common layer to the planar semiconductor top surface.

The semiconductor photo detector may comprise a p-n/p-i-n photodiode with one p-n or p-i-n junction in the center region, or the semiconductor photo detector may comprise a 2-terminal floating-base phototransistor with two p-n or p-i-n junctions in the center region. The semiconductor photodiode (PD) or phototransistor (PT) may be a planar photo detector, a mesa photo detector, or a combination thereof. A projection of the bipolarly doped center region onto a plane parallel to the common layer may be simply connected, and a projection of the unipolarly doped edge region onto a plane parallel to the common layer may be multiply connected. The bipolarly doped center region may be simply connected, and the unipolarly doped edge region may be multiply connected. The unipolarly doped edge region may surround the bipolarly doped center region. The bipolarly doped center region may optionally include a portion of the photon absorption layer. The unipolarly doped common layer may optionally include a portion of the photon absorption layer.

Some embodiments of the present disclosure relate to a detector in which the semiconductor photo detector may comprise at least one heterojunction, wherein the semiconductor layers and regions in the semiconductor photo detector may be group III-V semiconductor(s). The photon absorption layer may have an infrared long-wavelength cutoff greater than 1200 nanometers (nm), or, 1.2 micrometers (μm)

Some aspects of the present disclosure relate to a method of fabricating a semiconductor photo detector as described herein, the method comprising at least partially p-doping the unipolarly doped edge region by zinc (Zn) diffusion into a unipolarly n-doped epitaxial top layer in a group III-V semiconductor. Some aspects of the disclosure relate to a further method of fabricating the semiconductor photo detector, comprising at least partially p-doping the bipolarly doped center region by zinc (Zn) diffusion into a unipolarly n-doped epitaxial top layer in a group III-V semiconductor. The methods disclosed herein may be used singly or, in some embodiments, jointly, to manufacture semiconductor photodetectors.

DETAILED DESCRIPTION

Figure 1:
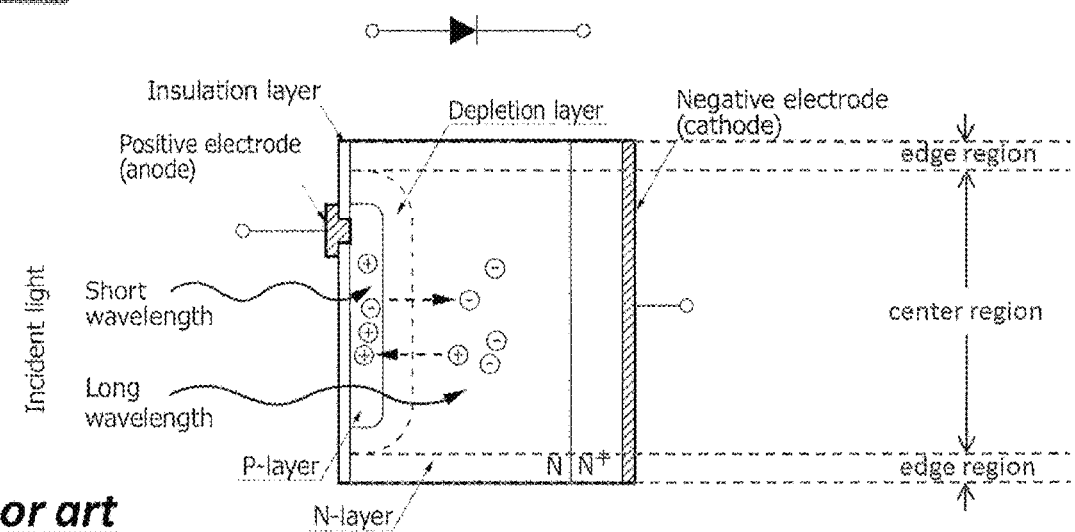
FIG. 1 illustrates a cross-section of planar silicon photodiode as disclosed by Hamamatsu, "Si Photodiodes"—selection guide, p. 41, February 2014.

Although the term phototransistor (PT) is used in this disclosure, the apparatuses and methods disclosed herein may be applicable to both homo-junction phototransistors and hetero-junction phototransistors (HPT), as would be appreciated by those having ordinary skill in the art. Therefore, the term "PT," as it is used herein, may be understood to encompass both homo-junction (e.g., silicon) phototransistors and hetero-junction (e.g., SiGe and SiGeC) phototransistors.

As used throughout this disclosure, the term "layer" denotes an essentially planar semiconductor structure parallel to the semiconductor substrate. Each layer may optionally further include multiple sub-layers.

As used throughout this disclosure, the term "region" denotes an imaginary right cylinder within a semiconductor with its bases parallel to the semiconductor substrate and with its side surfaces perpendicular to the semiconductor substrate. Here, a cylinder is mathematically defined as a closed solid with two parallel bases connected by a curved side surface; a right cylinder is mathematically defined as a cylinder whose curved side surface is perpendicular to its base; and, the base of a cylinder can be of any shape, either simply connected or non-simply connected, namely, multiply connected. Each region may optionally further include multiple sub-regions. Each region can be either simply connected or non-simply connected, namely, multiply connected.

Following standard definitions in mathematics, a pathwise-connected domain is said to be simply connected if any simple closed curve can be shrunk to a point continuously in the set. If the domain is connected but not simply, it is said to be multiply connected. A domain is simply-connected if and only if it is path-connected and every path between two points can be continuously transformed, staying within the domain, into any other path with the same two endpoints.

As used throughout this disclosure, the "terminal" of a diode, including a photodiode (PD), may refer to either the anode or the cathode of the diode electrically and directly connected to circuitry external to the diode. As used throughout this disclosure, the "terminal" of a bipolar junction transistor, including a bipolar junction phototransistor (PT), refers to the emitter of the bipolar junction transistor, the collector of the bipolar junction transistor, or the base of the bipolar junction transistor if the emitter, collector or base is electrically and directly connected to a circuitry external to the bipolar junction transistor. Therefore, a bipolar junction phototransistor is defined as a 3-terminal phototransistor (PT) when each of its emitter, base and collector is electrically and directly connected to an external circuitry; and a bipolar junction phototransistor is defined as a 2-terminal phototransistor (PT) when its emitter and collector are each electrically and directly connected to an external circuitry, but its base is not directly electrically connected to any external circuitry. The emitter, base or collector of the bipolar junction transistor is one single terminal when electrically and directly connected to an external circuitry, regardless of multiple connections made to the same emitter, base or collector.

As used throughout this disclosure, a semiconductor device may be defined as "planar" if its top semiconductor surface is planar but not necessarily atomically planar.

As used throughout this disclosure, a semiconductor layer/region/segment/portion/structure may be defined as unipolarly doped if it is not completely depleted, exhibits the same p-doping polarity or same n-doping polarity, contains no p-n or p-i-n junction, and contains no intrinsic region (i-region) throughout the semiconductor layer/region/segment/portion/structure.

As used throughout this disclosure, a photon absorption layer may be a semiconductor layer of minimum bandgap Eg either partially or completely within or above the common layer for the absorption of photons of the longest wavelength.

As used throughout this disclosure, the semiconductor substrate may be positioned at the down side/bottom side/below, while the detector devices are positioned at the up side/topside/above. The vertical positioning of the layers as down or up may be for purposes of illustration, and those skilled in the art will appreciate that a semiconductor substrate positioned at the down side of device, will be positioned on the up side of the device if the device were inverted.

FIG. 1 shows a cross-section of a planar silicon photodiode according to and excerpted from the prior art of Hamamatsu, "Si Photodiodes"—selection guide, p. 41, February 2014. As shown therein, the area of the edge region is less than the area of the center region as projected on a plane parallel to the common layer.

Figure 2:
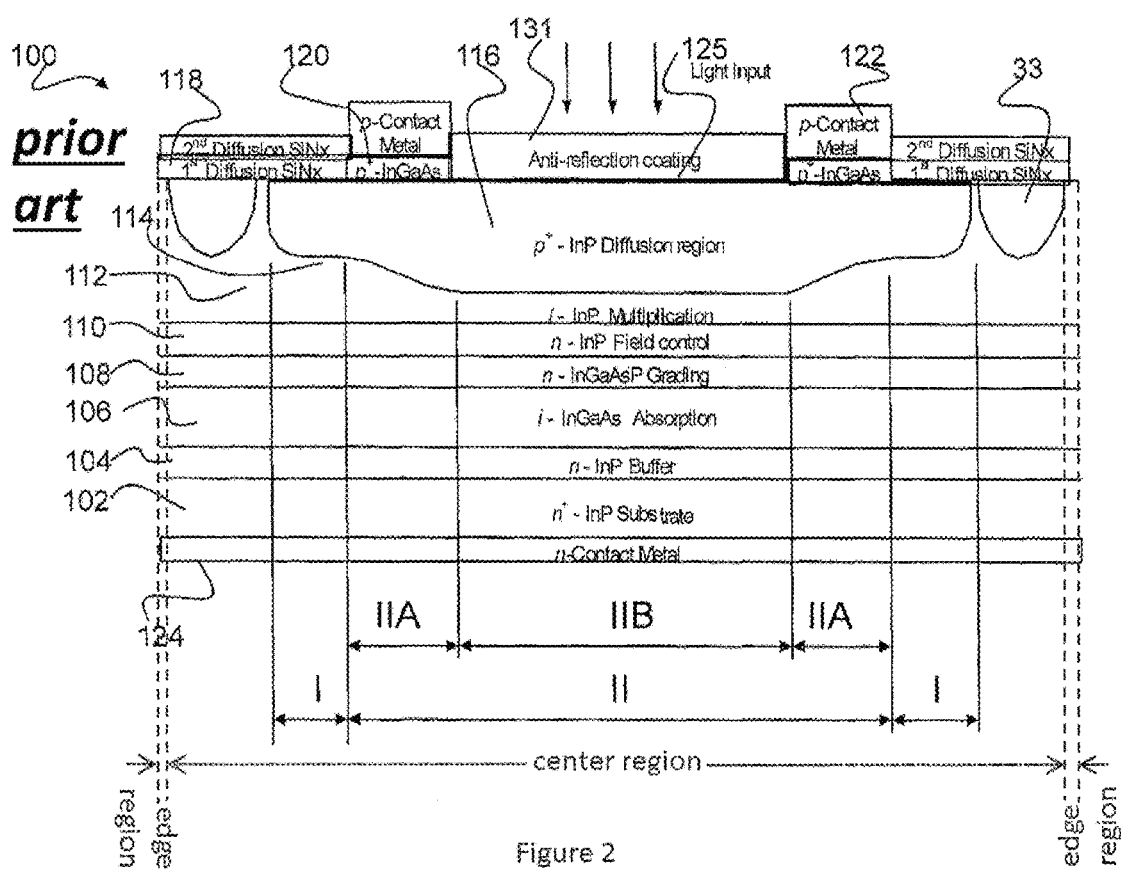
FIG. 2 illustrates a cross-section of planar InGaAs avalanche photodiode as disclosed by Zhong Pan, David Venables, Craig Ciesla, "Avalanche Photodiode With Edge Breakdown Suppression", U.S. Pat. No. 7,834,379, US 20090020782 A1, 16 Nov. 2010, JDS Uniphase.

FIG. 2 shows a cross-section of a planar InGaAs avalanche photodiode according to and excerpted from the prior art of Zhong Pan, David Venables, Craig Ciesla, "Avalanche Photodiode With Edge Breakdown Suppression", U.S. Pat. No. 7,834,379, US 20090020782 A1, 16 Nov. 2010, JDS Uniphase. The doped edge region contains intrinsic region (i-region) and hence is not unipolarly doped. Furthermore, the area of the edge region is less than the area of the center region as projected on a plane parallel to the common layer.

Figure 3:
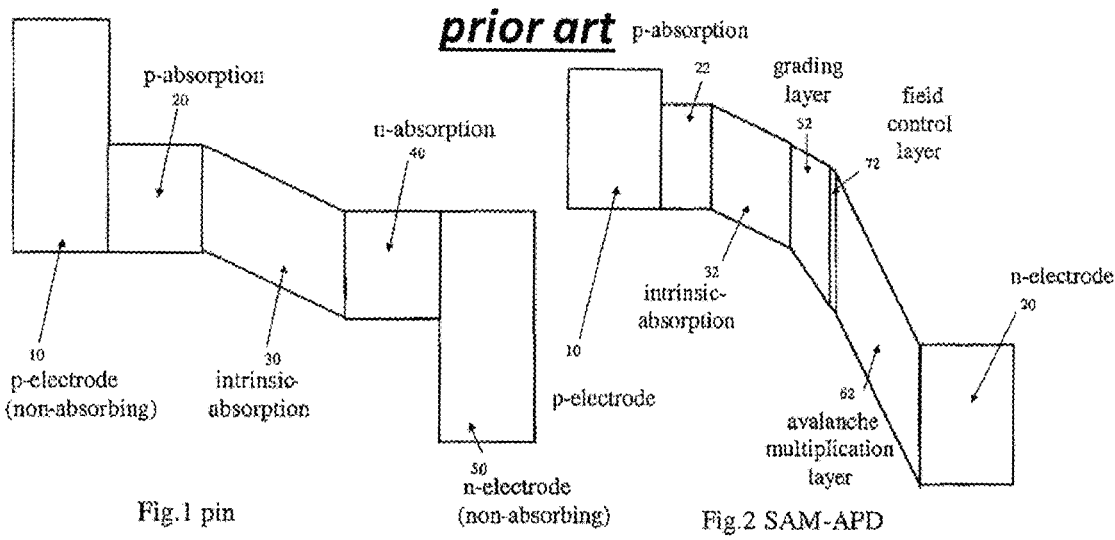
FIG. 3 illustrates an electron energy band diagram of InGaAs p-i-n photodiode and InGaAs avalanche photodiode as disclosed by Jie Yao, "Doped absorption for enhanced responsivity for high speed photodiodes", U.S. Pat. No. 7,202,102.

FIG. 3 shows an electron energy band diagram of a InGaAs p-i-n photodiode and InGaAs avalanche photodiode according to and excerpted from"Doped absorption for enhanced responsivity for high speed photodiodes", U.S. Pat. No. 7,202,102, U.S. Ser. No. 10/736,859, 10 Apr. 2007, JDS Uniphase, wherein no edge region is disclosed.

Figure 4:
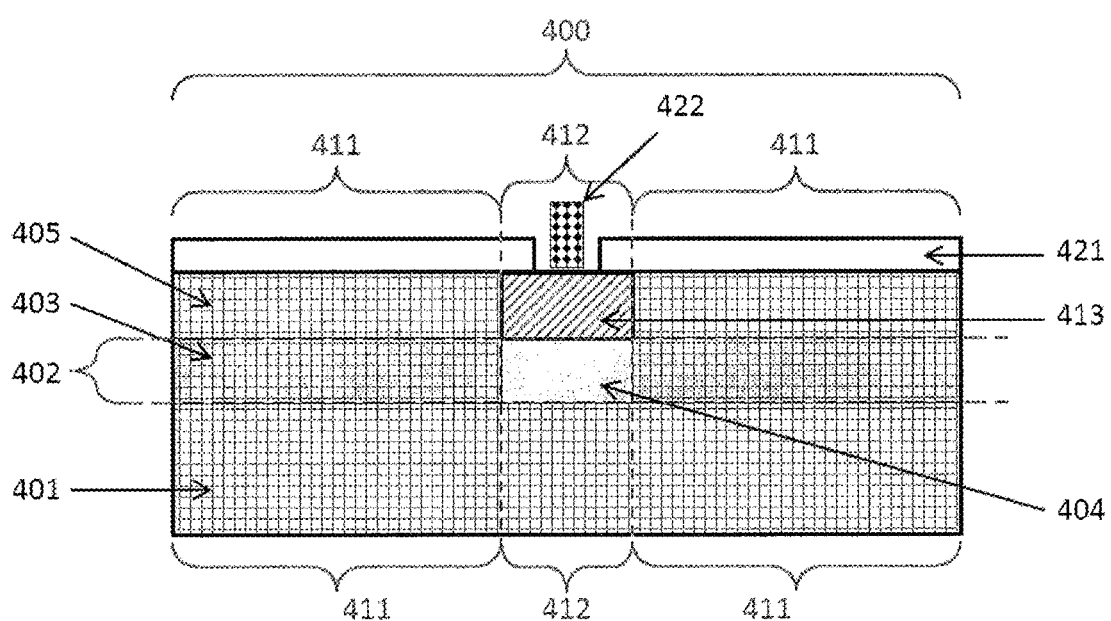
FIG. 4 illustrates a cross-sectional view of an embodiment of a photodiode (PD)/phototransistor (PT) having unipolar doping.

FIG. 4 depicts a cross-sectional view of a semiconductor photodiode (PD) or phototransistor (PT) photo detector 400 with unipolar doping, in accordance with an embodiment. An uppermost unipolarly doped and not completely depleted semiconductor common layer 401 comprises the same doping polarity throughout the layer. A photon absorption layer 402 (shown delineated by horizontal dash lines in FIG. 4) is positioned at least partially within and/or above the common layer 401, and comprises at least a doped photon absorption region 403. The photon absorption layer 402 may be positioned completely above, partially overlapping or completely within the common layer 401. The upper boundary of the common layer 401 may be displaced downward or upward from that shown in FIG. 4 to the lowest point of depletion or opposite doping above the lower boundary of the common layer 401, as those having ordinary skill in the art will recognize. A unipolarly doped edge region 411 (shown delineated by vertical dash lines in FIG. 4) may be positioned at least partially within and/or above the common layer 401, wherein the edge region 411 includes at least a portion 403 of the photon absorption layer 402 geometrically connected to the common layer 401, comprising the same doping polarity as the common layer 401. A bipolarly doped center region 412 (shown delineated by vertical dash lines in FIG. 4) may be positioned at least partially within and/or above the common layer 401, wherein the center region comprises at least one segment of a doping polarity opposite to the doping polarity of the common layer 401, and comprises at least one p-n or p-i-n junction. The unipolarly doped edge region 411 directly physically contacts the bipolarly doped center region 412. The area of the unipolarly doped edge region 411 may be at least 100 times greater than the area of the bipolarly doped center region 412 as projected on a plane parallel to the common layer 401. A dielectric 421 and an electrical contact 422 physically and directly contact the semiconductor top surface.

The photon absorption layer 402 may be positioned completely or partially within and/or above the common layer 401, the unipolarly doped edge region 411 may be positioned completely within and/or above the common layer 401, and the bipolarly doped center region 412 may be positioned completely within and/or above the common layer 401. The unipolarly doped edge region 411 may extend from the common layer 401 to a planar semiconductor top surface, and the bipolarly doped center region 412 may extend from the common layer 401 to the planar semiconductor top surface. The semiconductor photo detector 400 may comprise a p-n/p-i-n photodiode with one p-n or p-i-n junction in the center region 412, or the semiconductor photo detector 400 may comprise a 2-terminal floating-base phototransistor with two p-n or p-i-n junctions in the center region 412. A projection of the bipolarly doped center region 412 on a plane parallel to the common layer 401 may be simply connected, and a projection of the unipolarly doped edge region 411 on a plane parallel to the common layer 401 may be multiply connected. The bipolarly doped center region 412 may be simply connected, and the unipolarly doped edge region 411 may be multiply connected. The unipolarly doped edge region 411 may surround the bipolarly doped center region 412. The bipolarly doped center region 412 may optionally include a portion 404 of the photon absorption layer 402. The unipolarly doped common layer 401 may optionally include a portion of the photon absorption layer 402.

The semiconductor photo detector 400 may comprise at least one heterojunction. The semiconductor layers and regions of the semiconductor photo detector 400 may be group III-V semiconductor(s). The photon absorption layer 402 may have an infrared long-wavelength cutoff greater than about 1200 nanometers (nm), or about 1.2 micrometers (n). One method of fabricating the semiconductor photo detector 400 may comprise at least partially p-doping the unipolarly doped edge region 411 by zinc (Zn) diffusion into a unipolarly n-doped epitaxial top layer of a group III-V semiconductor. Another method of fabricating the semiconductor photo detector 400 may comprise at least partially p-doping the bipolarly doped center region 412 by zinc (Zn) diffusion into a unipolarly n-doped epitaxial top layer of a group III-V semiconductor. The methods disclosed herein may be used singly or, in some embodiments, jointly, to manufacture semiconductor photo detectors.

The unipolarly doped edge region 411 may comprise a Zn-diffused p-doped region 405, the Zn-diffused p-doped photon absorption region 403 and portion(s) of the p-doped common layer 401. The bipolarly doped center region 412 may comprise multiple regions containing at least one n-doped region 413, the optional not-intentionally-doped intrinsic or depleted photon absorption region 404 and portion(s) of the p-doped common layer 401. The photon absorption layer 402 may comprise the Zn-diffused p-doped photon absorption region 403 and the optional not-intentionally-doped intrinsic or depleted photon absorption region 404. N-doped region 413 may adjoin p-doped region 405 at at least one interface, naturally forming a p-n or p-i-n junction (not shown), which junction may optionally adjoin the optional not-intentionally-doped intrinsic or depleted photon absorption region 404.

A photo detector array may comprise a plurality of semiconductor photo detectors 400, an image sensor may comprise the photo detector array, and an instrument may comprise the image sensor.

Figure 5:
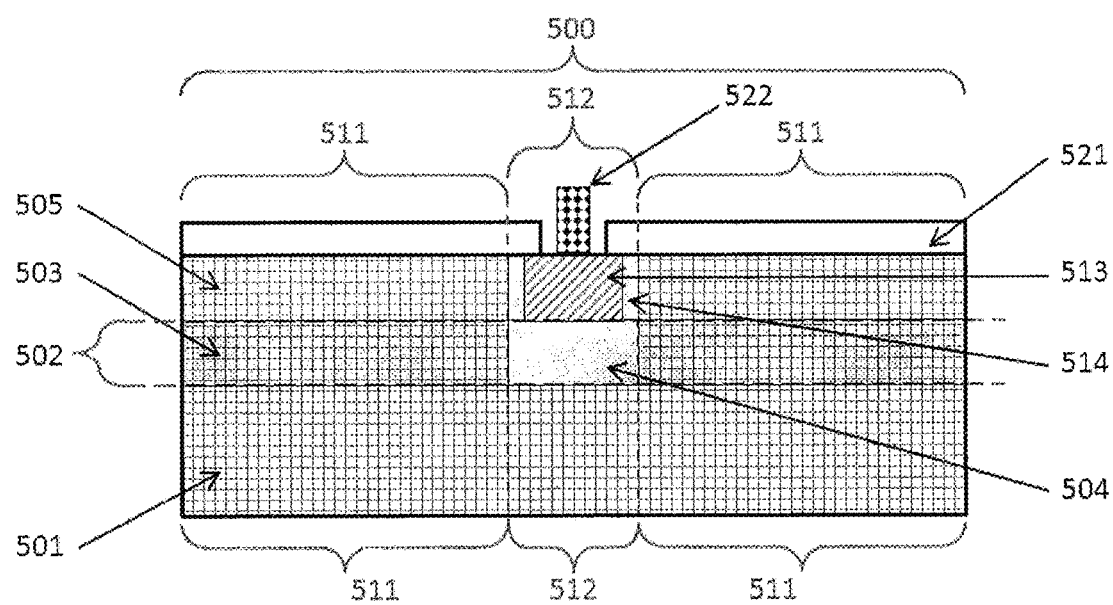
FIG. 5 illustrates a cross-sectional view of an embodiment of a planar photodiode (PD) having unipolar doping.

FIG. 5 depicts a cross-sectional view of a planar photodiode (PD) 500 with unipolar doping, in accordance with an embodiment. An uppermost unipolarly doped and not completely depleted semiconductor common layer 501 comprises the same doping polarity throughout the layer. A photon absorption layer 502 (shown delineated by horizontal dash lines in FIG. 5) may be positioned at least partially within and/or above the common layer 501, and comprises at least a doped photon absorption region 503. The photon absorption layer 502 may be positioned completely above, partially overlapping or completely within the common layer 501. The upper boundary of the common layer 501 may be displaced downward or upward from that shown in FIG. 5 to the lowest point of depletion or opposite doping above the lower boundary of the common layer 501, as those having ordinary skill in the art will recognize. A unipolarly doped edge region 511 (shown delineated by vertical dash lines in FIG. 5) may be positioned at least partially within and/or above the common layer 501, wherein the edge region 511 includes at least a portion 503 of the photon absorption layer 502, is geometrically connected to the common layer 501, and comprises the same doping polarity as the common layer 501. A bipolarly doped center region 512 (shown delineated by vertical dash lines in FIG. 5) may be positioned at least partially within and/or above the common layer 501, wherein the center region comprises at least one segment of a doping polarity opposite to the doping polarity of the common layer 501, and comprises at least one p-n or p-i-n junction. The unipolarly doped edge region 511 directly physically contacts the bipolarly doped center region 512. The area of the unipolarly doped edge region 511 may be at least 100 times greater than the area of the bipolarly doped center region 512 as projected on a plane parallel to the common layer 501. A dielectric 521 and an electrical contact 522 physically and directly contact the semiconductor top surface.

The photon absorption layer 502 may be positioned completely or partially within and/or above the common layer 501, the unipolarly doped edge region 511 may be positioned completely within and/or above the common layer 501, and the bipolarly doped center region 512 may be positioned completely within and/or above the common layer 501. The unipolarly doped edge region 511 may extend from the common layer 501 to a planar semiconductor top surface, and the bipolarly doped center region 512 may extend from the common layer 501 to the planar semiconductor top surface. The semiconductor photo detector 500 may comprise a p-n/p-i-n photodiode with one p-n or p-i-n junction in the center region 512, A projection of the bipolarly doped center region 512 on a plane parallel to the common layer 501 may be simply connected, and a projection of the unipolarly doped edge region 511 on a plane parallel to the common layer 501 may be multiply connected. The bipolarly doped center region 512 may be simply connected, and the unipolarly doped edge region 511 may be multiply connected. The unipolarly doped edge region 511 may surround the bipolarly doped center region 512. The bipolarly doped center region 512 may optionally include a portion 504 of the photon absorption layer 502. The unipolarly doped common layer 501 may optionally include a portion of the photon absorption layer 502.

The semiconductor photo detector 500 may comprise at least one heterojunction. The semiconductor layers and regions in the semiconductor photo detector 500 may be group III-V semiconductor(s). The photon absorption layer 502 may have an infrared long-wavelength cutoff greater than about 1200 nanometers (nm), or about 1.2 micrometers (m). One method of fabricating the semiconductor photo detector 500 may comprise at least partially p-doping the unipolarly doped edge region 511 by zinc (Zn) diffusion into a unipolarly n-doped epitaxial top layer of a group III-V semiconductor. The other method of fabricating the semiconductor photo detector 500 may comprise at least partially p-doping the bipolarly doped center region 512 by zinc (Zn) diffusion into a unipolarly n-doped epitaxial top layer of a group III-V semiconductor. The methods disclosed herein may be used singly, or in combination, to form semiconductor photodiodes.

The unipolarly doped edge region 511 may comprise a Zn-diffused p-doped region 505 as a portion of anode, the Zn-diffused p-doped photon absorption region 503 as a portion of anode and portion(s) of the p-doped common layer 501 as a portion of anode. The bipolarly doped center region 512 may comprise an n-doped cathode 513, a depleted region 514, the optional photon absorption region 504 and portion(s) of the p-doped common layer 501 as a portion of anode. N-doped cathode 513 may be isolated from p-doped region 505 by depleted region 514. N-doped cathode 513 may be isolated from p-doped common layer 501 by depleted region 504, when present. The optional photon absorption region 504 may be not-intentionally-doped intrinsic or fully depleted or partially depleted with remaining p-doping as a portion of anode. The photon absorption layer 502 may comprise the Zn-diffused p-doped photon absorption region 503 and the optional not-intentionally-doped intrinsic or depleted photon absorption region 504.

A photo detector array may comprise a plurality of semiconductor photo detectors 500, an image sensor may comprise the photo detector array, and an instrument may comprise the image sensor.

Figure 6:
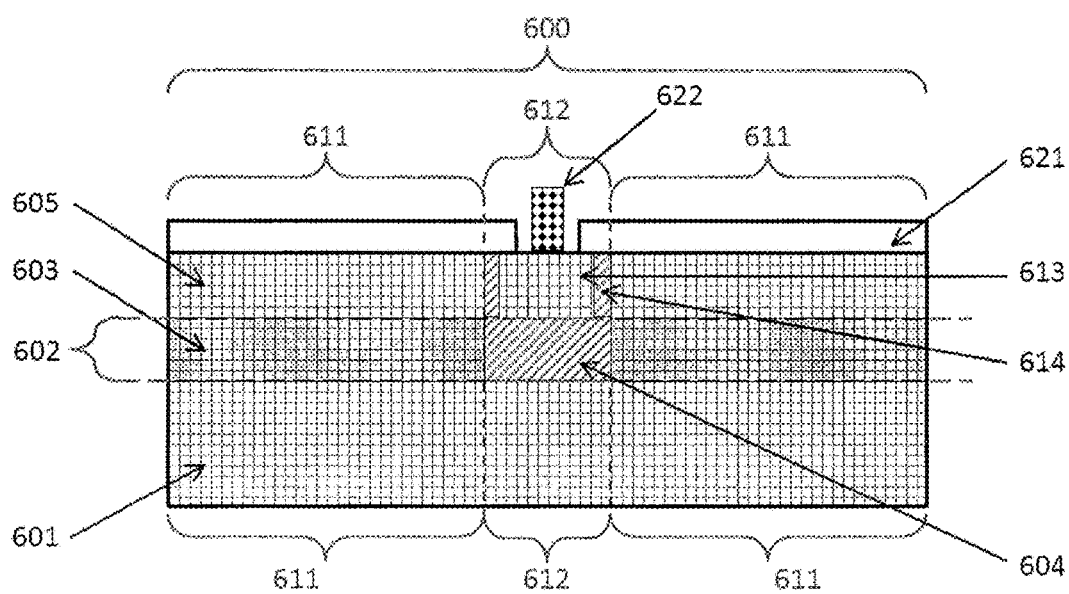
FIG. 6 illustrates a cross-sectional view of a planar phototransistor (PT) having unipolar doping, and having depletion regions between n-doped and p-doped regions NOT shown.

FIG. 6 depicts a cross-sectional view of a planar phototransistor (PT) 600 with unipolar doping, and with depletion regions between n-doped and p-doped regions NOT shown but expected to be appreciated by those having ordinary skill in the art, in accordance with an embodiment. An uppermost unipolarly doped and not completely depleted semiconductor common layer 601 comprises the same doping polarity throughout the layer. A photon absorption layer 602 (shown delineated by horizontal dash lines in FIG. 6) is positioned at least partially within and/or above the common layer 601, and comprises at least a doped photon absorption region 603. The photon absorption layer 602 may be positioned completely above, partially overlapping or completely within the common layer 601. The upper boundary of the common layer 601 may be displaced downward or upward from that shown in FIG. 6 to the lowest point of depletion or opposite doping above the lower boundary of the common layer 601, as those having ordinary skill in the art will recognize. A unipolarly doped edge region 611 (shown delineated by vertical dash lines in FIG. 6) may be positioned at least partially within and/or above the common layer 601, wherein the edge region 611 includes at least a portion 603 of the photon absorption layer 602, geometrically connects to the common layer 601, and comprises the same doping polarity as the common layer 601. A bipolarly doped center region 612 (shown delineated by vertical dash lines in FIG. 6) may be positioned at least partially within and/or above the common layer 601, wherein the center region comprises at least one segment of a doping polarity opposite to the doping polarity of the common layer 601, and comprises at least one p-n or p-i-n junction. The unipolarly doped edge region 611 directly physically contacts the bipolarly doped center region 612. The area of the unipolarly doped edge region 611 may be at least 100 times greater than the area of the bipolarly doped center region 612 as projected on a plane parallel to the common layer 601. A dielectric 621 and an electrical contact 622 extend upward from the semiconductor top surface.

The photon absorption layer 602 may be positioned completely or partially within and/or above the common layer 601, the unipolarly doped edge region 611 may be positioned completely within and/or above the common layer 601, and the bipolarly doped center region 612 may be positioned completely within and/or above the common layer 601. In some embodiments, the unipolarly doped edge region 611 may extend from the common layer 601 to a planar semiconductor top surface, and the bipolarly doped center region 612 may extend from the common layer 601 to the planar semiconductor top surface. In some embodiments, the semiconductor photo detector 600 may comprise a 2-terminal floating-base phototransistor with two p-n or p-i-n junctions in the center region 612. A projection of the bipolarly doped center region 612 on a plane parallel to the common layer 601 may be simply connected, and a projection of the unipolarly doped edge region 611 on a plane parallel to the common layer 601 may be multiply connected. The bipolarly doped center region 612 may be simply connected, and the unipolarly doped edge region 611 may be multiply connected. The unipolarly doped edge region 611 may surround the bipolarly doped center region 612. The bipolarly doped center region 612 may optionally include a portion 604 of the photon absorption layer 602. The unipolarly doped common layer 601 may optionally include a portion of the photon absorption layer 602.

The semiconductor photo detector 600 may comprise at least one heterojunction. One or more of the semiconductor layers and regions of the semiconductor photo detector 600 may be group III-V semiconductor(s). In an embodiment, all the semiconductor layers and regions of the semiconductor photo detector may be group III-IV semiconductors. The photon absorption layer 602 may have an infrared long-wavelength cutoff greater than 1200 nm or 1.2 micrometers (μm). One method of fabricating the semiconductor photo detector 600 may comprise at least partially p-doping the unipolarly doped edge region 611 by zinc (Zn) diffusion into a unipolarly n-doped epitaxial top layer in a group III-V semiconductor. The other method of fabricating the semiconductor photo detector 600 may comprise at least partially p-doping the bipolarly doped center region 612 by zinc (Zn) diffusion into a unipolarly n-doped epitaxial top layer in a group III-V semiconductor. The methods disclosed herein for forming semiconductor photodetectors may be used individually, or in combination, according to some embodiments.

The unipolarly doped edge region 611 may comprise a Zn-diffused p-doped region 605 as a portion of collector, the Zn-diffused p-doped photon absorption region 603 as a portion of collector and portion(s) of the p-doped common layer 601 as a portion of collector. The bipolarly doped center region 612 may comprise Zn-diffused p-doped emitter 613, a portion 614 of n-doped floating base outside the photon absorption layer 602, the portion 604 of n-doped floating base inside the photon absorption layer 602, and portion(s) of the p-doped common layer 601 as a portion of collector. The portion 614 of the n-doped floating base may extend from a semiconductor top surface down to a top of the photon absorption layer 602. The photon absorption layer 602 may comprise the Zn-diffused p-doped photon absorption region 603 and the portion 604 of n-doped floating base. P-doped emitter 613 may be isolated from p-doped region 605 by the portion 614 of the n-doped floating base. Depletion regions naturally form between n-doped and p-doped regions resulting in p-n and/or p-i-n junctions, which are NOT shown as they will be appreciated by those having ordinary skill in the art.

A photo detector array may comprise a plurality of semiconductor photo detectors 600, an image sensor may comprise the photo detector array, and an instrument may comprise the image sensor.

Figure 7:
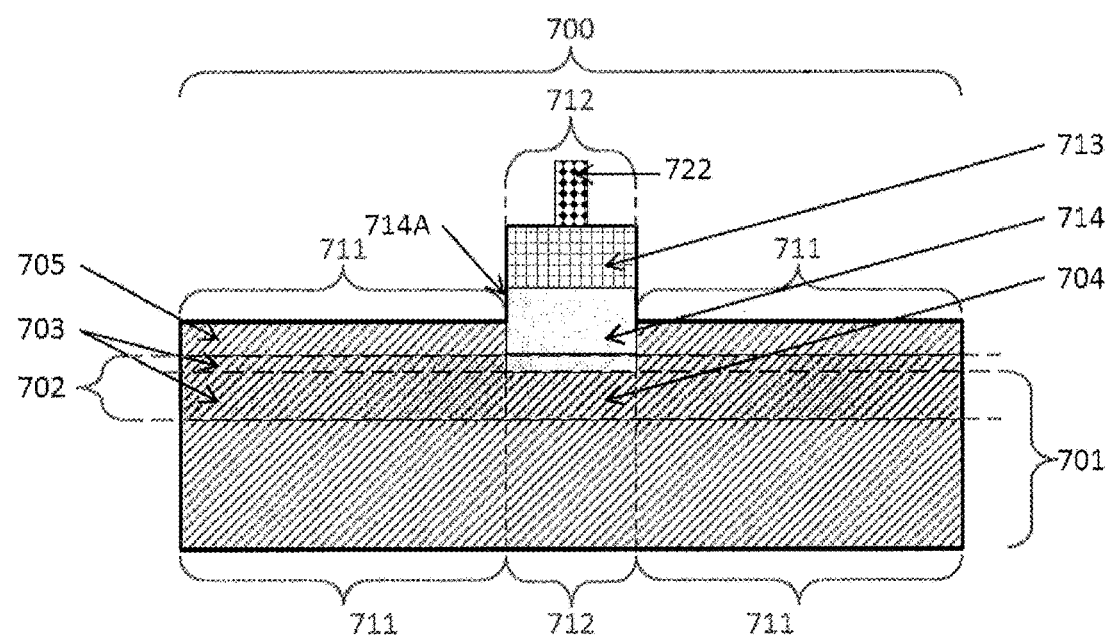
FIG. 7 illustrates a cross-sectional view of an embodiment of a mesa photodiode (PD) with unipolar doping, and having dielectric NOT shown.

FIG. 7 depicts a cross-sectional view of mesa photodiode (PD) 700 with unipolar doping, and with dielectric NOT shown but expected to be appreciated by those having ordinary skill in the art, in accordance with an embodiment. An uppermost unipolarly doped and not completely depleted semiconductor common layer 701 (shown delineated by horizontal dash lines in FIG. 7) comprises the same doping polarity throughout the layer. A photon absorption layer 702 (shown delineated by horizontal dash lines in FIG. 7) is positioned at least partially within and/or above the common layer 701, and comprises at least a doped photon absorption region 703. The photon absorption layer 702 may be positioned completely above, partially overlapping or completely within the common layer 701. The upper boundary of the common layer 701 may be displaced downward or upward from that shown in FIG. 7 to the lowest point of depletion or opposite doping above the lower boundary of the common layer 701, as those having ordinary skill in the art will recognize. A unipolarly doped edge region 711 (shown delineated by vertical dash lines in FIG. 7) is positioned at least partially within and/or above the common layer 701, wherein the edge region 711 includes at least a portion 703 of the photon absorption layer 702 geometrically connects to the common layer 701, and comprises the same doping polarity as the common layer 701. A bipolarly doped center region 712 (shown delineated by vertical dash lines in FIG. 7) may be positioned at least partially within and/or above the common layer 701, wherein the center region comprises at least one segment of a doping polarity opposite to the doping polarity of the common layer 701, and comprises at least one p-n or p-i-n junction. The unipolarly doped edge region 711 may directly physically contact the bipolarly doped center region 712. The area of the unipolarly doped edge region 711 may be at least 100 times greater than the area of the bipolarly doped center region 712 as projected on a plane parallel to the common layer 701. An electrical contact 722 physically and directly contacts the semiconductor top surface.

The photon absorption layer 702 may be positioned completely or partially within and/or above the common layer 701, the unipolarly doped edge region 711 may be positioned completely within and/or above the common layer 701, and the bipolarly doped center region 712 may be positioned completely within and/or above the common layer 701. The unipolarly doped edge region 711 may extend from the common layer 701 to a planar portion of the semiconductor top surface, and the bipolarly doped center region 712 may extend from the common layer 701 to the planar portion of the semiconductor top surface. The semiconductor photo detector 700 may comprise a p-n/p-i-n photodiode with one p-n or p-i-n junction in the center region 712. A projection of the bipolarly doped center region 712 on a plane parallel to the common layer 701 may be simply connected, and a projection of the unipolarly doped edge region 711 on a plane parallel to the common layer 701 may be multiply connected. The bipolarly doped center region 712 may be simply connected, and the unipolarly doped edge region 711 may be multiply connected. The unipolarly doped edge region 711 may surround the bipolarly doped center region 712. The bipolarly doped center region 712 may optionally include a portion 704 of the photon absorption layer 702. The unipolarly doped common layer 701 may optionally include a portion of the photon absorption layer 702.

The semiconductor photo detector 700 may comprise at least one heterojunction. All the semiconductor layers and regions in the semiconductor photo detector 700 may be in group III-V semiconductor(s). The photon absorption layer 702 may have an infrared long-wavelength cutoff greater than 1200 nanometers (nm), or, 1.2 micrometers (μm).

The unipolarly doped edge region 711 may comprise an n-doped region 705 as a portion of cathode, the n-doped photon absorption region 703 as a portion of cathode and portion(s) of the n-doped common layer 701 as a portion of cathode. The bipolarly doped center region 712 may comprise a p-doped anode 713, a depleted region 714, the n-doped region 704 as a portion of cathode and portion(s) of the n-doped common layer 701 as a portion of cathode. A top edge of the depleted region 714 may be parallel with, but above, the top surface of the unipolarly doped edge region 711, such that an upper portion 714A of a side of the depleted region 714 separates the p-doped anode 713 from a top surface of the unipolarly doped edge region 711. The photon absorption layer 702 may comprise the n-doped photon absorption region 703 and the n-doped region 704. Dielectrics may be necessary but NOT shown as they will be appreciated by those having ordinary skill in the art.

A photo detector array may comprise a plurality of semiconductor photo detectors 700, an image sensor may comprise the photo detector array, and an instrument may comprise the image sensor.

Figure 8:
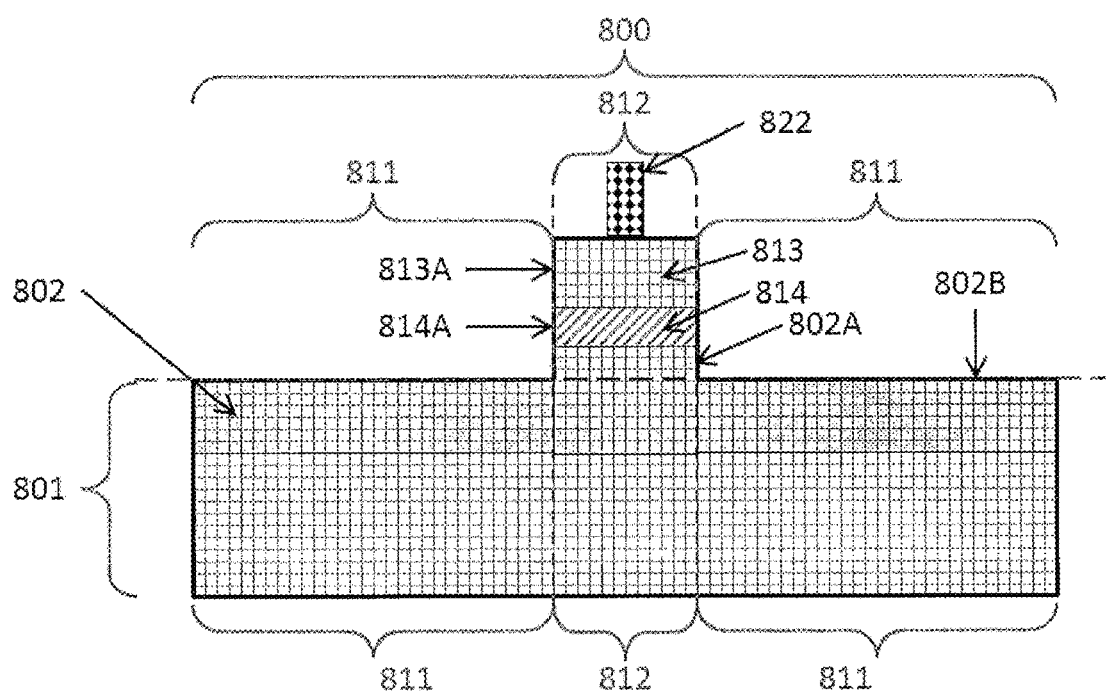
FIG. 8 illustrates a cross-sectional view of an embodiment of a mesa phototransistor (PT) with unipolar doping, having depletion regions between n-doped and p-doped regions NOT shown, and having dielectric NOT shown.

FIG. 8 illustrates a cross-sectional view of mesa phototransistor (PT) 800 with unipolar doping, with depletion regions between n-doped and p-doped regions NOT shown, and with dielectric NOT shown, both being expected to be appreciated by those having ordinary skill in the art, in accordance with an embodiment. An uppermost unipolarly doped and not completely depleted semiconductor common layer 801 (shown delineated by horizontal dash lines in FIG. 8) comprises the same doping polarity throughout the layer. A photon absorption layer 802 may be at least partially within and/or above the common layer 801. The photon absorption layer 802 may be positioned completely above, partially overlapping or completely within the common layer 801. The upper boundary of the common layer 801 may be displaced downward or upward from that shown in FIG. 8 to the lowest point of depletion or opposite doping above the lower boundary of the common layer 801, as those having ordinary skill in the art will recognize. A unipolarly doped edge region 811 (shown delineated by vertical dash lines in FIG. 8) may be positioned at least partially within and/or above the common layer 801, wherein the edge region 811 includes at least a portion of the photon absorption layer 802, abuts the common layer 801, and comprises the same doping polarity as the common layer 801. A bipolarly doped center region 812 (shown delineated by vertical dash lines in FIG. 8) may be at least partially within and/or above the common layer 801, wherein the center region comprises at least one segment of a doping polarity opposite to the doping polarity of the common layer 801, and comprises at least one p-n or p-i-n junction. The unipolarly doped edge region 811 may adjoin the bipolarly doped center region 812. The area of the unipolarly doped edge region 811 is at least 100 times greater than the area of the bipolarly doped center region 812 as projected on a plane parallel to the common layer 801. An electrical contact 822 physically and directly contacts the semiconductor top surface. The photon absorption layer 802 may be positioned completely or partially within and/or above the common layer 801, the unipolarly doped edge region 811 may be positioned completely within and/or above the common layer 801, and the bipolarly doped center region 812 may be positioned completely within and/or above the common layer 801. The unipolarly doped edge region 811 may extend from the common layer 801 to a planar portion of the semiconductor top surface, and the bipolarly doped center region 812 may extend from the common layer 801 to the planar portion of the semiconductor top surface.

The semiconductor photo detector 800 may comprise a 2-terminal floating-base phototransistor with two p-n or p-i-n junctions in the center region 812. A projection of the bipolarly doped center region 812 on a plane parallel to the common layer 801 may be simply connected, and a projection of the unipolarly doped edge region 811 on a plane parallel to the common layer 801 may be multiply connected. The bipolarly doped center region 812 may be simply connected, and the unipolarly doped edge region 811 may be multiply connected. The unipolarly doped edge region 811 may surround the bipolarly doped center region 812. The bipolarly doped center region 812 may optionally include a portion of the photon absorption layer 802. The unipolarly doped common layer 801 may optionally include a portion of the photon absorption layer 802.

The semiconductor photo detector 800 may comprise at least one heterojunction. The semiconductor layers and regions in the semiconductor photo detector 800 may be group III-V semiconductor(s). In an embodiment, all the semiconductor layers and regions of the semiconductor photo detector 800 may be group III-IV semiconductors. The photon absorption layer 802 may have an infrared long-wavelength cutoff greater than 1200 nanometers (nm), or, 1.2 micrometers (μm). One implementation of a method for fabricating the semiconductor photo detector 800 may comprise at least partially p-doping the edge region 811 by zinc (Zn) diffusion into an epitaxial top layer in a group III-V semiconductor. One implementation of a method of fabricating the semiconductor photo detector 800 may comprise at least partially p-doping the center region 812 by zinc (Zn) diffusion into an epitaxial top layer in a group III-V semiconductor. The disclosed implementations of making a photo detector as disclosed herein may be employed individually or in combination, according to embodiments of the present disclosure.

The unipolarly doped edge region 811 may comprise a portion of the p-doped photon absorption layer 802 as a portion of collector and portion(s) of the p-doped common layer 801 as a portion of collector. The bipolarly doped center region 812 may comprise a p-doped emitter 813, an n-doped floating base 814, a portion of the p-doped photon absorption layer 802 as a portion of collector, and portion(s) of the p-doped common layer 801 as a portion of collector. A top surface of p-doped absorption layer 802 and its extension region may comprise a horizontal portion 802B and a sidewall 802A, wherein sidewall 802A separates horizontal portion 802B from an n-doped floating base sidewall 814A and from p-doped emitter sidewall 813A. N-doped floating base sidewall 814A may further separate p-doped emitter sidewall 813A from sidewall 802A. Depletion regions naturally formed between n-doped and p-doped regions resulting in p-n and/or p-i-n junctions are NOT shown, and dielectrics are NOT shown, as will be appreciated by those having ordinary skill in the art.

A photo detector array may comprise a plurality of semiconductor photo detectors 800, an image sensor may comprise the photo detector array, and an instrument may comprise the image sensor.

While the invention has been described with reference to particularly preferred embodiments and with reference to the drawings, a person having ordinary skill in the art will appreciate that the disclosed embodiments are not limiting, and that various modifications may be made to the embodiments disclosed herein.

What is claimed is:

1. A semiconductor photo detector comprising:
   an uppermost unipolarly doped and not completely depleted semiconductor common layer comprising the same doping polarity throughout the layer;
   a photon absorption layer positioned at least partially within and/or above the common layer;
   a unipolarly doped edge region positioned at least partially within and/or above the common layer, wherein the edge region includes at least a portion of the photon absorption layer, is geometrically connected to the common layer, and comprises the same doping polarity as the common layer;
   a bipolarly doped center region positioned at least partially within and/or above the common layer, wherein the center region comprises at least one segment of a doping polarity opposite to the doping polarity of the common layer, and comprises at least one p-n or p-i-n junction;
   wherein the unipolarly doped edge region and the bipolarly doped center region are in direct physical contact with each other; and wherein the area of the unipolarly doped edge region is at least 100 times greater than the area of the bipolarly doped center region as projected on a plane parallel to the common layer.

2. The semiconductor photo detector of claim 1, wherein the photon absorption layer is positioned completely within and/or above the common layer, wherein the unipolarly doped edge region is positioned completely within and/or above the common layer, and wherein the bipolarly doped center region is positioned completely within and/or above the common layer.

3. The semiconductor photo detector of claim 2, wherein the unipolarly doped edge region extends from the common layer to a planar semiconductor top surface, and wherein bipolarly doped center region extends from the common layer to the planar semiconductor top surface.

4. The semiconductor photo detector of claim 1, comprising a p-n/p-i-n photodiode with one p-n or p-i-n junction in the center region.

5. The semiconductor photo detector of claim 4, wherein the photodiode is a planar or mesa photodiode.

6. The semiconductor photo detector of claim 1, comprising a 2-terminal floating-base phototransistor with two p-n or p-i-n junctions in the center region.

7. The semiconductor photo detector of claim 6, wherein the phototransistor is a planar or mesa phototransistor.

8. The semiconductor photo detector of claim 1, wherein a projection of the bipolarly doped center region on a plane parallel to the common layer is simply connected, and wherein a projection of the unipolarly doped edge region on a plane parallel to the common layer is multiply connected.

9. The semiconductor photo detector of claim 1, wherein the bipolarly doped center region is simply connected, and wherein the unipolarly doped edge region is multiply connected.

10. The semiconductor photo detector of claim 1, wherein the unipolarly doped edge region surrounds the bipolarly doped center region.

11. The semiconductor photo detector of claim 1, wherein the bipolarly doped center region optionally includes a portion of the photon absorption layer.

12. The semiconductor photo detector of claim 1, wherein the unipolarly doped common layer optionally includes a portion of the photon absorption layer.

13. The semiconductor photo detector of claim 1, comprising at least one heterojunction.

14. The semiconductor photo detector of claim 1, wherein all the semiconductor layers and regions are in group III-V semiconductor(s).

15. The semiconductor photo detector of claim 1, wherein the photon absorption layer has an infrared long-wavelength cutoff greater than 1200 nanometers (nm).

16. A method of fabricating the semiconductor photo detector of claim 1, comprising at least partially p-doping the unipolarly doped edge region by zinc (Zn) diffusion into a unipolarly n-doped epitaxial top layer in a group III-V semiconductor.

17. A method of fabricating the semiconductor photo detector of claim 1, comprising at least partially p-doping the bipolarly doped center region by zinc (Zn) diffusion into a unipolarly n-doped epitaxial top layer in a group III-V semiconductor.

18. An array comprising a plurality of semiconductor photo detectors of claim 1.

19. An image sensor comprising the array of claim 18.

20. An instrument comprising the image sensor of claim 19.

* * * * *